(12) United States Patent
Gill

(10) Patent No.: US 7,324,310 B2
(45) Date of Patent: Jan. 29, 2008

(54) SELF-PINNED DUAL CPP SENSOR EXCHANGE PINNED AT STRIPE BACK-END TO AVOID AMPLITUDE FLIPPING

(75) Inventor: Hardayal Singh Gill, Palo Alto, CA (US)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 516 days.

(21) Appl. No.: 10/837,192

(22) Filed: Apr. 30, 2004

(65) Prior Publication Data
US 2005/0243474 A1 Nov. 3, 2005

(51) Int. Cl.
G11B 5/39 (2006.01)
G11B 5/127 (2006.01)

(52) U.S. Cl. .............................. 360/324.11; 360/324.2

(58) Field of Classification Search .............. 360/324.2, 360/324.11, 324.1, 314, 321, 324.12
See application file for complete search history.

(56) References Cited

U.S. PATENT DOCUMENTS

| | | | |
|---|---|---|---|
| 5,784,224 A | 7/1998 | Rottmayer et al. | 360/113 |
| 5,818,685 A * | 10/1998 | Thayamballi et al. | 360/324 |
| 6,064,552 A | 5/2000 | Iwasaki et al. | 360/113 |
| 6,271,998 B1 | 8/2001 | Coehoorn et al. | 360/324.2 |
| 6,327,121 B1 | 12/2001 | Nagasawa et al. | 360/324.11 |
| 6,396,668 B1 | 5/2002 | Mao et al. | 360/314 |
| 6,411,478 B1 | 6/2002 | Mao et al. | 360/324.2 |
| 6,445,554 B1 | 9/2002 | Dong et al. | 360/324.2 |
| 6,567,247 B1 | 5/2003 | Araki et al. | 360/324.12 |
| 6,611,405 B1 | 8/2003 | Inomata et al. | 360/324.2 |
| 6,624,988 B2 * | 9/2003 | Gill | 360/324.2 |
| 6,667,862 B2 | 12/2003 | Zhu | 360/324.12 |
| 6,757,144 B2 * | 6/2004 | Carey et al. | 360/324.2 |
| 7,035,062 B1 * | 4/2006 | Mao et al. | 360/324.2 |
| 2003/0042562 A1 | 3/2003 | Giebeler et al. | 257/421 |
| 2004/0008450 A1 | 1/2004 | Gill | 360/314 |
| 2004/0017641 A1 | 1/2004 | Jayasekara | 360/324.2 |
| 2004/0141257 A1 * | 7/2004 | Hasegawa et al. | 360/314 |
| 2004/0207959 A1 * | 10/2004 | Saito | 360/324.1 |
| 2004/0207960 A1 * | 10/2004 | Saito et al. | 360/324.1 |
| 2004/0207962 A1 * | 10/2004 | Saito et al. | 360/324.11 |

FOREIGN PATENT DOCUMENTS

| | | | |
|---|---|---|---|
| JP | 2000163717 | | 6/2000 |
| JP | 2002163807 A | * | 6/2002 |
| JP | 2002270920 | | 9/2002 |

* cited by examiner

*Primary Examiner*—William J Kklimowicz
(74) *Attorney, Agent, or Firm*—Zilka-Kotab, PC

(57) ABSTRACT

A current perpendicular to plane (CPP) giant magnetoresistive (GMR) sensor having a pinning structure recessed disposed behind the sensor in the stripe height direction.

24 Claims, 7 Drawing Sheets

SELF-PINNED DUAL CPP SENSOR EXCHANGE PINNED AT STRIPE BACK-END TO AVOID AMPLITUDE FLIPPING

FIELD OF THE INVENTION

The present invention relates to giant magnetoresistive (GMR) sensors and more particularly to a novel pinning structure for a current perpendicular to plane (CPP) GMR sensor.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of a rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos θ, where θ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

A spin valve sensor is characterized by a magnetoresistive (MR) coefficient that is substantially higher than the MR coefficient of an anisotropic magnetoresistive (AMR) sensor. For this reason a spin valve sensor is sometimes referred to as a giant magnetoresistive (GMR) sensor. When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Sensors can also be categorized as current in plane (CIP) sensors or as current perpendicular to plane (CPP) sensors. In a CIP sensor, current flows from one side of the sensor to the other side parallel to the planes of the materials making up the sensor. Conversely, in a CPP sensor the sense current flows from the top of the sensor to the bottom of the sensor perpendicular to the plane of the layers of material making up the sensor. In a CPP sensor design, the magnetic shields usually double as electrical leads for supplying a sense current to the sensor. Therefore, in CPP sensor design, the shields/leads contact the top and bottom of the sensor, and the space between the shields defines the length of a bit of data.

The ever increasing demand for data storage density and data rate have increasingly pushed the limits of data storage designs. Recently in efforts to overcome such limits, engineers and scientists have focused on the use of perpendicular recording. In a perpendicular recording system a write pole emits a highly concentrated magnetic field that is directed perpendicular to the surface of the medium (eg. the disk). This field in turn magnetizes a localized portion of the disk in a direction perpendicular to the surface of the disk, thereby creating a bit of data. The resulting flux travels through the disk to a return path having a much larger area than the area in which the bit was recorded. The increased interest in perpendicular recording has lead to an increased interest in current perpendicular to plane (CPP) sensors, which are particularly suited to use in perpendicular recording.

Ever increasing demands for increased data density and data rate have also pushed sensor designs to decrease the size of a bit of data in order to fit more bits onto a given length of data track. In a CPP design, this requires shrinking the distance between the shields/leads of the sensor to decrease the length of the data bits that can be read by the sensor. One method used to reduce this length between shields (or gap height) has been to eliminate the AFM pinning layer used to maintain the magnetization of the pinned layer. As discussed above, sensor designs have used a layer of AFM material to set the pinning of the pinned layer of a sensor. This saves a great deal of gap budget, because in order for an AFM layer to effectively set the pinning of a pinned layer, the AFM must be constructed very thick. In fact the AFM is usually much thicker than many of the other layers of the sensor combined.

In order to eliminate the AFM layer, sensors have been recently designed as "self pinned" sensors, wherein a pair of antiparallel pinned layers having a strong positive magnetostriction are pinned by a combination of positive magnetostriction and compressive forces present in the sensor. One problem that has arisen as a result of such self pinning designs is that the pinned layers can be prone to flipping. The positive magnetostriction tends to keep the magnetization of AP pinned layers oriented perpendicular to the ABS of the sensor. However, if the sensor undergoes a stress, such as a heat spike, the pinned layers can change orientation, an event referred to as amplitude flipping. This renders the sensor unusable.

In addition, the push for increased data rate and data density requires ever improved sensor performance which can be measured as GMR effect or dr/R. This can be achieved, for example by constructing a sensor having multiple free layer to pinned layer interfaces. Such a sensor has been referred to as a dual GMR sensor, however, a practical design for such a sensor that achieves proper pinned layer/free layer orientation and acceptable stack height has not yet been developed.

Therefore, there remains a need for a design that can reduce the gap height (distance between shields/leads) while achieving robust pinning. Such a design would preferably be useable in a CPP sensor design since such sensors have promising futures for use in future perpendicular recording systems. In addition, there remains a need for a means for increasing GMR effect or dr/R of a sensor.

SUMMARY OF THE INVENTION

The present invention provides a current perpendicular to plane CPP giant magnetoresistive (GMR) sensor having a recessed pinning stack. The sensor includes a sensor stack having a back edge that defines a stripe height. The stripe height is the depth of the sensor as measured from the ABS into the sensor. The sensor includes a sensor stack having first and second antiparallel couple pinned layers and a free layer sandwiched there between. The free layer is separated from the pinned layers by first and second spacer layers, or in the case of a tunnel valve by first and second barrier layers.

The pinned layer structures each include a pair of antiparallel coupled magnetic layers, and one magnetic layer from each pinned layer structure extends backward beyond the stripe height of the sensor. A pinning structure is formed between and exchange coupled to the backward extending portions of the backward extending magnetic layers. This pinning structure includes first and second layers of antiferromagnetic material exchange coupled with each of the backward extending portions of the backward extending magnetic layers, and these antiferromagnetic layers or "AFM layers" set the magnetizations of these backward extending magnetic layers.

The present invention advantageously fixes the magnetization of the pinned layers of the sensor, without adding increasing the gap length, (ie. bit length or sensor thickness). Because the AFM layers are disposed behind the sensor and between portion of the layers that they are exchange coupled to they no valuable gap budget is used. In this way, the invention provides exceptional pinned layer robustness, without sacrificing gap budget.

The present invention also advantageously increases dr/R sensor performance by providing for a dual GMR sensor having two pinned layer structures sharing a common free layer. The present invention also advantageously provides such a sensor in a current perpendicular to plane (CPP) design, which is particularly suitable for use in future perpendicular recording systems.

These and other advantages of the present invention will become more clear upon a reading of the following detailed description of the invention taken in conjunction with the Figures, which are not to scale and in which like reference numerals refer to like elements in the Figures.

BRIEF DESCRIPTION OF THE DRAWINGS

For a fuller understanding of the nature and advantages of this invention, as well as the preferred mode of use, reference should be made to the following detailed description read in conjunction with the accompanying drawings.

BEST MODE FOR CARRYING OUT THE INVENTION

The following description is of the best embodiments presently contemplated for carrying out this invention. This description is made for the purpose of illustrating the general principles of this invention and is not meant to limit the inventive concepts claimed herein.

Figure 1:
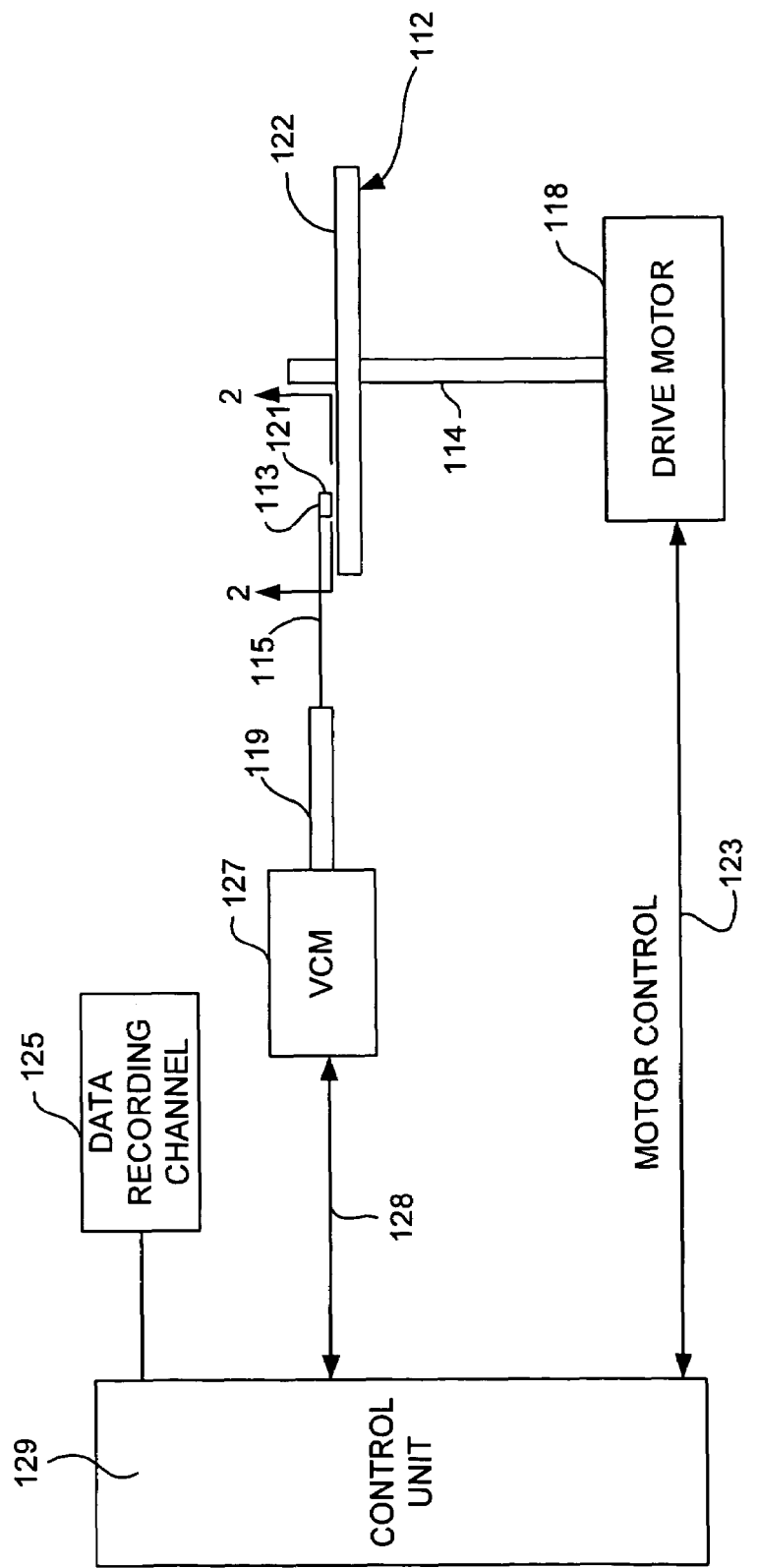
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
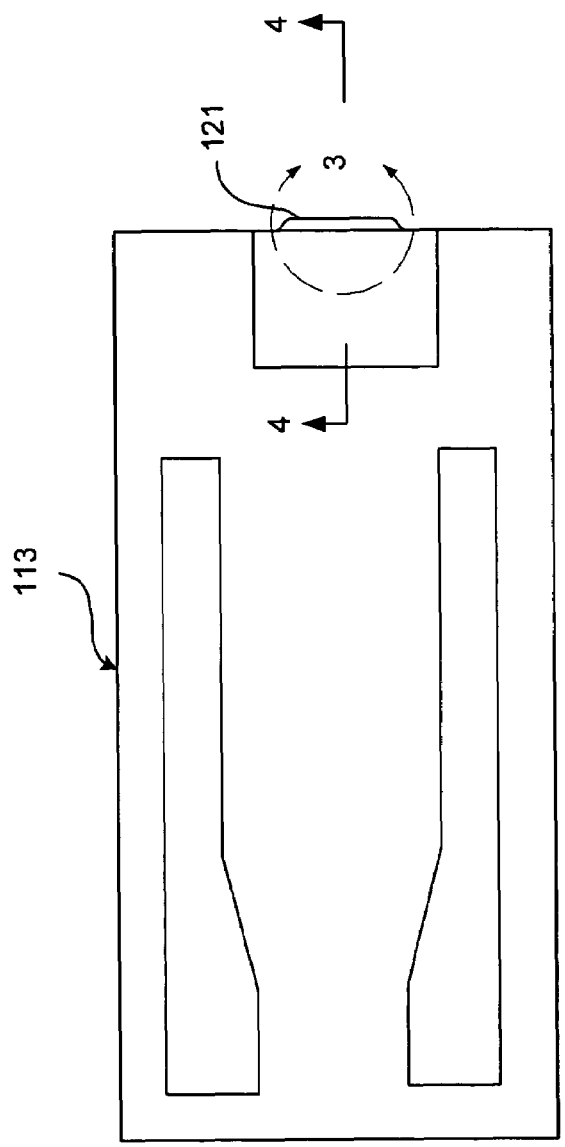
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
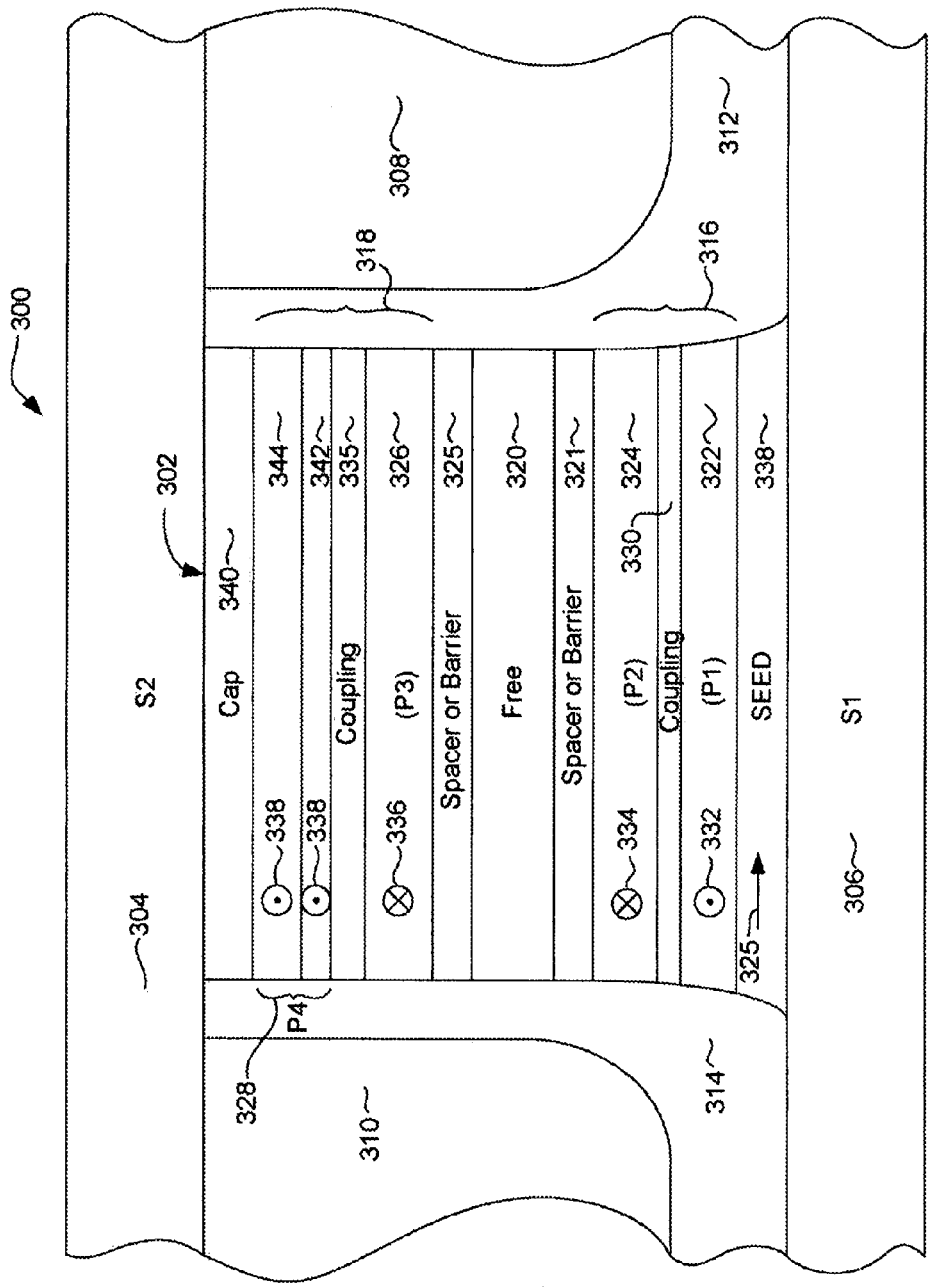
FIG. 3 is an ABS view of a magnetic sensor according to an embodiment of the present invention taken from circle 3 of FIG. 2, shown enlarged and rotated 90 degrees counterclockwise.
Figure 4:
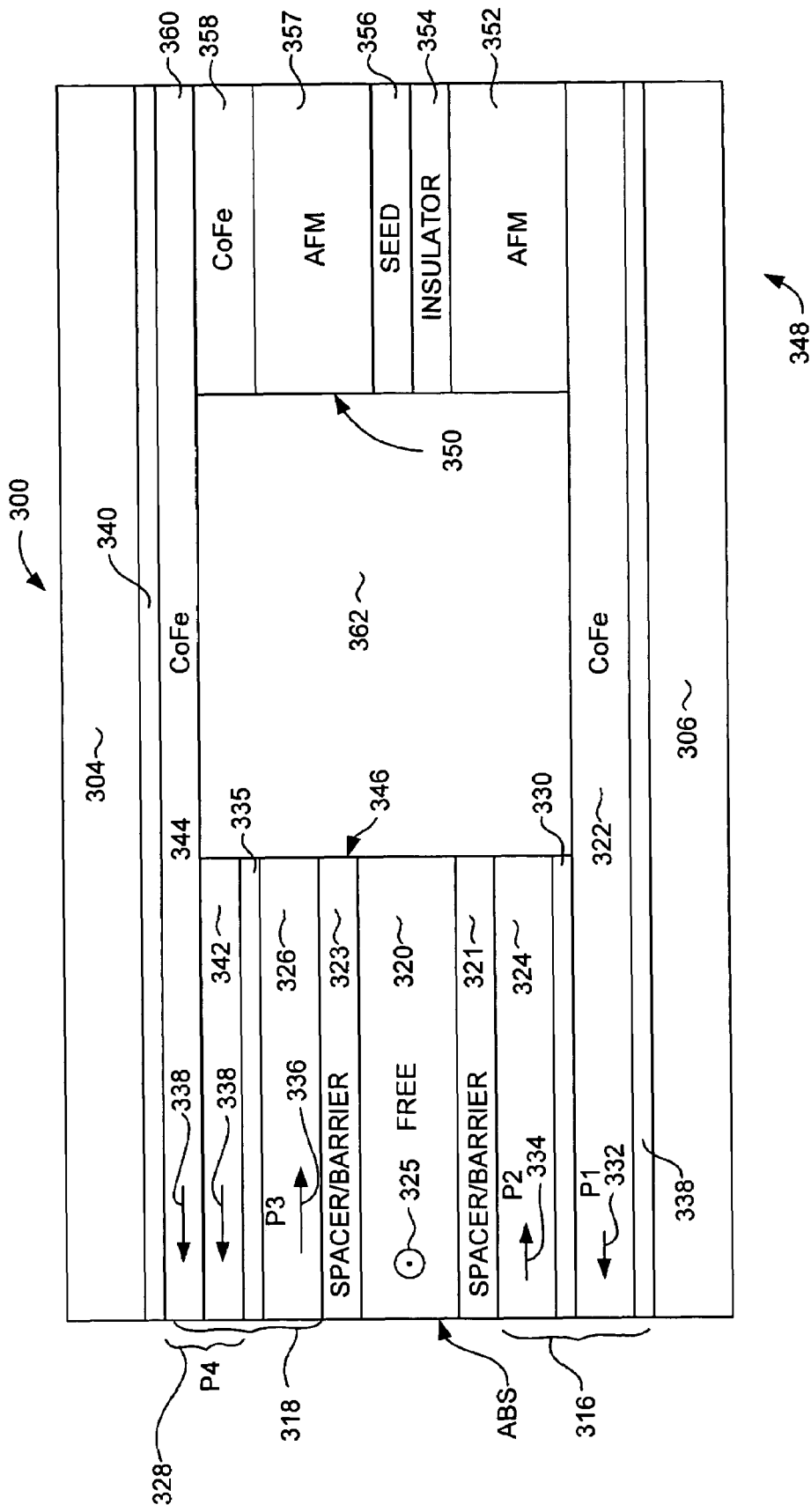
FIG. 4 is a sectional view of a magnetic sensor according to an embodiment of the present invention taken from line 4-4 of FIG. 2, shown enlarged and rotated 90 counterclockwise.

FIGS. 3 and 4, illustrate a magnetoresistive sensor 300, included on the magnetic head assembly 121 of the slider 113. The sensor 300 is shown as viewed from the ABS (FIG. 3) and in cross section (FIG. 4) as viewed perpendicular to the ABS. The sensor includes sensor stack 302, sandwiched between first and second electrically conductive magnetic shields 304, 306, which also serve as electrical leads for supplying sense current to the sensor 300.

With particular reference to FIG. 3, first and second hard bias layers 308, 310 are formed at either side of the sensor stack 302, and are insulated there from by first and second electrically insulating layers 312, 314. The hard bias layers 308, 310 are constructed of a high coercivity (high Hc) material such as CoPt or CoPtCr, and are magnetized by exposure to a magnetic field to become permanent magnets, which bias the magnetization of the free layer 320, which will be discussed further below. The insulating layers prevent current from being shunted from one shield 304 to the other 306 across the electrically conductive bias layers 308, 310.

With reference again to FIGS. 3 and 4, the sensor stack 302 includes first and second pinned layer structures 316, 318, and a free layer 320 sandwiched there between. First and second spacer layers 321, 323 separate the free layer from each of the pinned layer structures 316, 318. It should be pointed out at this point that although the present invention is described as a GMR sensor, the present invention could also be practiced in a tunnel valve senor. If the present invention were embodied in a tunnel valve sensor, the layers 321, 323 would be electrically insulating barrier layers, constructed of for example $Al_2O_3$.

The free layer 320 is constructed of a magnetic material such as Co, CoFe or some combination of these or other magnetic materials. The magnetization of the free layer 320 is biased parallel to the ABS as indicated by arrow 325, but is free to rotate in the presence of a magnetic field such as from a nearby magnetic medium. As discussed above, biasing is provided by the first and second bias layers 308, 310 which act as permanent magnets to provide a fixed magnetic biasing field.

Each pinned layer 316, 318 includes a pair of antiparallel coupled magnetic layers 322, 324, 326, 328. For purposes of simplicity, the first and second magnetic layers 322, 324 of the first pinned layer structure 326 will hereafter be referred to as first and second magnetic layers 322, 324, and the magnetic layers 326, 328 of the second magnetic layer 318 will hereafter be referred to as third and fourth magnetic layers 326, 328. The first second third and fourth magnetic layers 322, 324, 326 and 328 can be constructed of for example CoFe, which provides desirable magnetostrictive properties.

The magnetization of the first and second magnetic layers 322, 324 of the first pinned layer structure 316 are antiparallel coupled across an antiparallel coupling layer 330, which can be constructed of for example Ru. The magnetizations of the magnetic layers 322, 324 are directed perpendicular to the ABS as indicated by arrow symbols 332, 334.

Similarly, the third and fourth magnetic layers 326, 328 of the second pinned layer structure 318 are antiparallel coupled across a second antiparallel coupling layer 335. The third and fourth magnetic layers 326, 328 have magnetizations directed perpendicular to the ABS as indicated by arrows 336, 338. In order for the combined GMR effect of the two pinned layers 316, 318 to be additive rather than subtractive, it is important that the magnetizations 334, 336 of the second and third magnetic layers 324, 326 be in phase (ie. oriented in the same direction). As can be seen, the fourth magnetic layer 328 comprises two magnetic layers 342, 344, preferably of the same material. The reason for this construction will discussed further in a discussion of the construction of the present embodiment of the invention.

In addition, a seed layer 338, is provided beneath the first magnetic layer 322 of the first pinned layer 316. This seed layer ensures proper epitaxial growth of the subsequently deposited layers. Also, a capping layer 340 is preferably provided at the top of the sensor stack 302 to protect the layers thereof from damage such as by corrosion.

With reference to FIG. 4 the sensor stack 302 has a back edge 346 that defines a stripe height of the sensor stack 302. In addition, it can be seen that the first magnetic layer 322 extends substantially back beyond the stripe height location 346 into a recessed region 348. Similarly, the second layer 344 of the fourth magnetic layer 328 extends back beyond the stripe height location 346 into the recessed region 348.

With continued reference to FIG. 4, a pinning structure 350 extends between the backward extending portion of the first magnetic layer 322, and the backward extending layer 344 of the fourth magnetic layer 328. An antiferromagnetic material layer 352 is formed at the bottom of the pinning structure 350 and is exchange coupled with the first magnetic layer 322 to firmly fix the magnetization of the first magnetic layer 322. This first AFM layer 352 can be constructed of for example PtMn or other suitable antiferromagnetic materials. An insulating layer 354, such as $Al_2O_3$ is deposited over the AFM layer 352 to prevent shunting of the sense current through the pinning structure from one shield/lead 304 to the other 306. A seed layer 356 is then deposited over the insulating layer 354 to initiate a desired grain structure such as a face centered cubic (FCC) grain structure in the subsequently deposited layers. The seed layer can be for example NiFeCr, PtMn, Ta, Ru or a combination of these or other materials such as multilayers of combinations of these materials.

With continued reference to FIG. 4, a second AFM layer 357 is deposited on top of the seed layer 356. The second AFM is exchange coupled with a magnetic exchange coupling layer 358, which can be constructed of a magnetic material such as CoFe. The exchange coupling layer 358 is in turn exchange coupled to the backward extending layer 344 of the fourth magnetic layer 328 and firmly fixes the magnetization thereof in a desired direction perpendicular to the ABS. A dielectric fill material 362 separates the pinning structure 350 and the sensor stack 302, filling the space therebetween.

Figure 5:
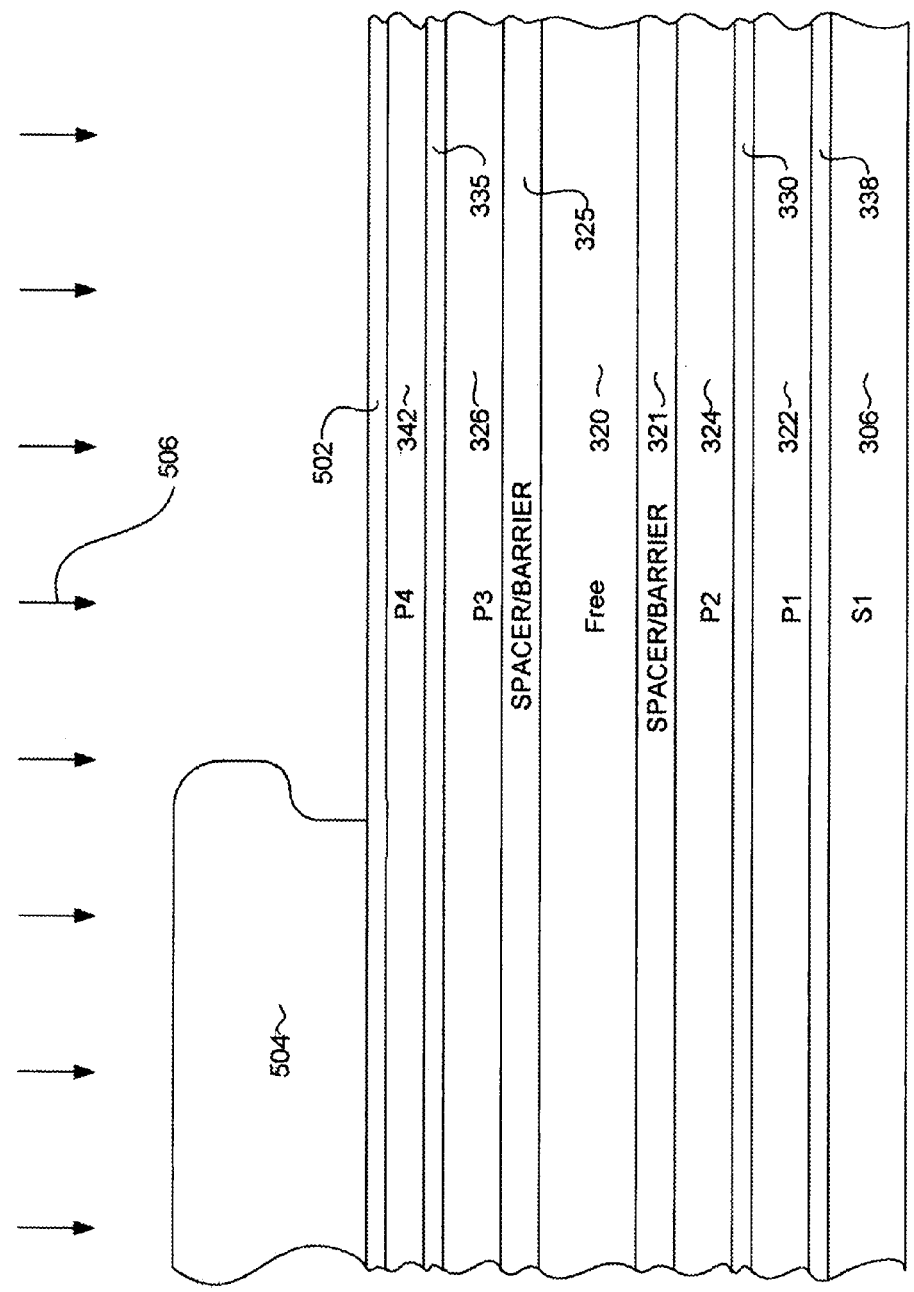
FIGS. 5-7 are cross sectional views of a magnetic sensor according to an embodiment of the invention in various intermediate stages of manufacture.
Figure 6:
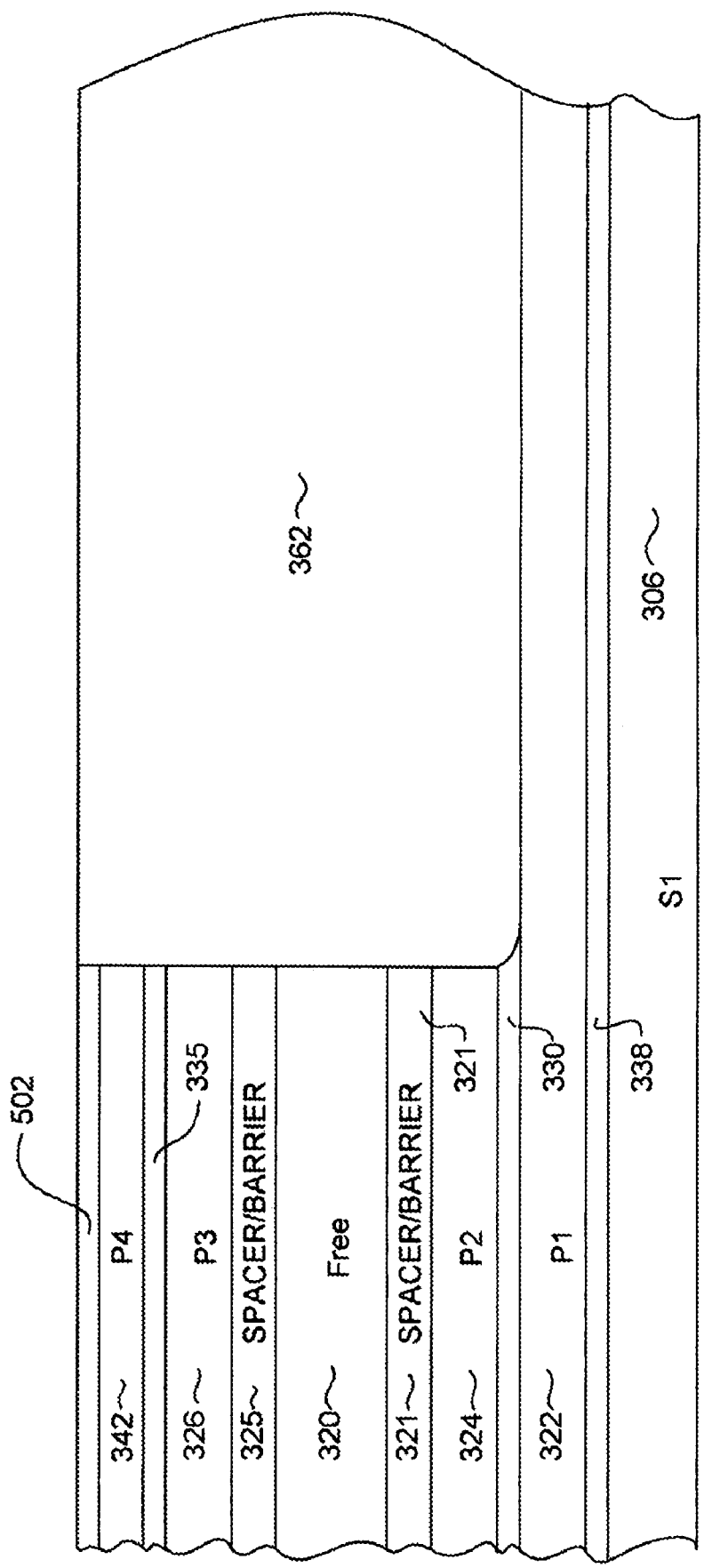
Figure 7:
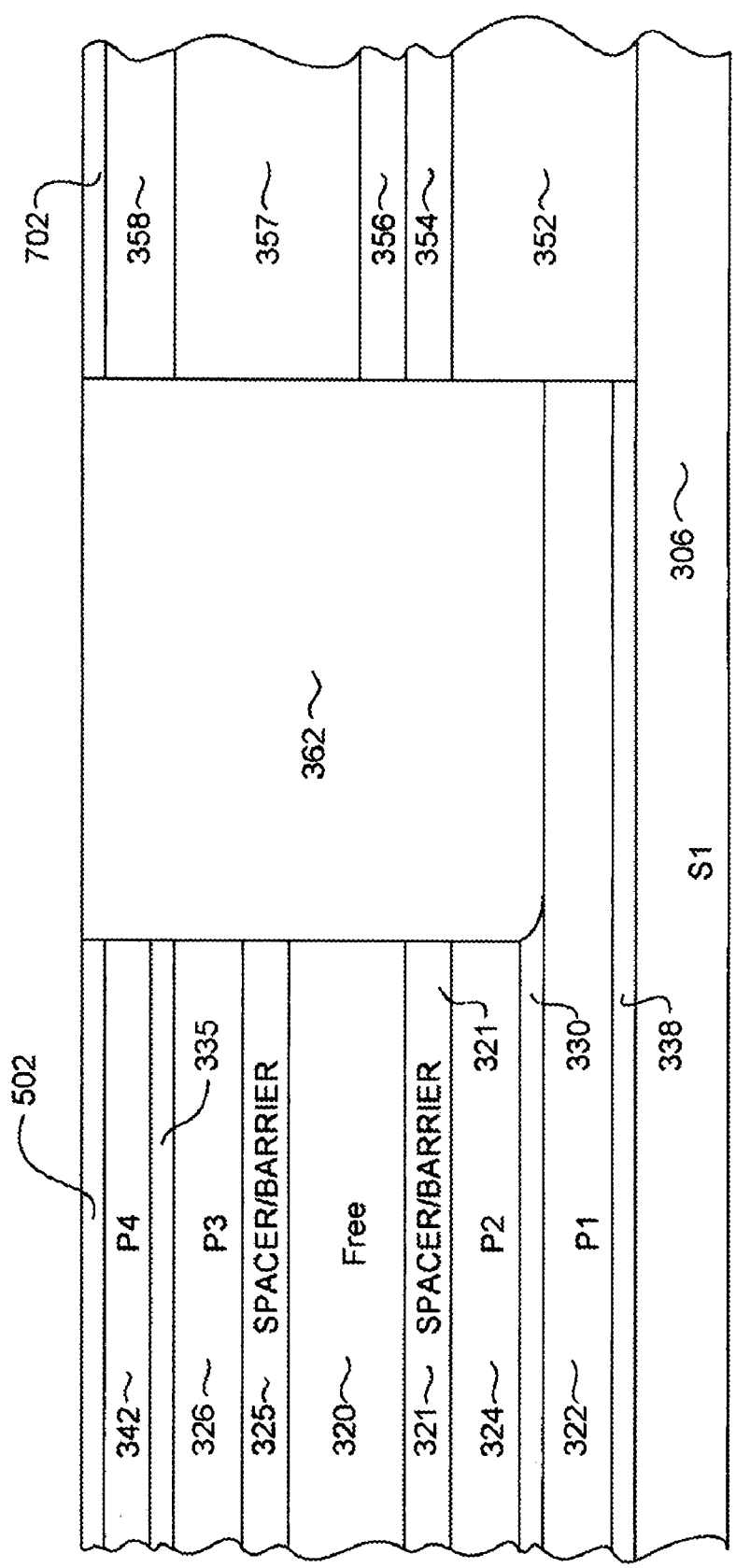

With reference now to FIGS. 5 through 7, one possible process for constructing an embodiment of the invention will be described. With particular reference to FIG. 5, the various layers making up the sensor stack are deposited as full film layers. These include: the shield/lead 306, seed 338, first magnetic layer 322, first coupling layer 330, second magnetic layer 324, first spacer or barrier layer 321, free layer 320, second spacer or barrier layer 325, third magnetic layer 326, second coupling layer 335, and first portion fourth magnetic layer 342. In addition, a first temporary capping layer 502 is deposited to protect the previously deposited layers from corrosion during manufacture.

With continued reference to FIG. 5, a photoresist mask layer 504 is then formed to cover the area where the desired sensor stack 302 (FIG. 3) will be. A material removal process 506, such as for example reactive ion etch (RIE) is then performed to remove material not covered by the photoresist mask 504.

With reference now to FIG. 6, the photoresist mask is removed and a layer of dielectric material such as $Al_2O_3$ is deposited to form the fill material 362. The fill material 362 on top of the photoresist is lifted off by chemical mechanical polishing (CMP). A second photoresist mask (not shown) can then be formed, covering the sensor stack 302 and a portion of the dielectric fill material 362, and extending to the location where the pinning structure will be. A second material removal process can then be performed to (also not shown) to remove portions of the fill material 362 not covered by the photoresist mask.

With reference now to FIG. 7, the layers making up the sensor stack 350 can be deposited. These layers can include: the first AFM layer 352, insulation layer 354, seed layer 356, second AFM layer 357, and exchange coupling layer 358. In addition, another capping layer 702 is deposited over the top of the pinning structure to protect the layers from damage such as corrosion during subsequent manufacturing processes. The capping layer 702 can be for example Ru. Thereafter, the second layer portion 344 of the fourth magnetic layer 328 can be deposited to extend from the sensor stack to the pinning structure. However, before deposition of the magnetic layer 344 initiates, in an in situ process (inside the deposition chamber) a material removal process such as reactive ion etching is performed to remove the capping layers 502 and 702 respectively. This will allow the capping layers to be removed without exposing the underlying layers to a corrosive environment. Thereafter, layers 344, 340 and the second shield layer 304 can be deposited as will be familiar to those skilled in the art.

The reason that the fourth magnetic layer 328 is constructed as two layers, is that in order to properly couple with the underlying Ru layer, the magnetic layer 342 must be deposited in situ immediately after deposition of the Ru layer. The second layer, 344 is then added to extend back to the pinning structure 350 and will advantageously exchange couple with the underlying magnetic layer 342. Similarly, the exchange coupling layer 358, of the pinning structure can be deposited in situ with the second AFM layer 357 so that it will be able to exchange couple therewith.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A current perpendicular to plane (CPP) magnetoresistive sensor having a surface defining an air bearing surface (ABS), said sensor, comprising:
   a first pinned layer structure
   a second pinned layer structure;
   a free layer disposed between said first and second pinned layer structures;
   said first and second pinned layer structures and said free layer forming a sensor stack having a back edge defining a stripe height measured perpendicular to said ABS;
   said first pinned layer structure having a backward extending portion extending beyond said stripe height of said sensor stack;
   said second pinned layer structure having a backward extending portion extending beyond said stripe height;
   a pinning structure disposed between said backward extending portion of said first pinned layer structure and said backward extending portion of said second pinned layer structure; wherein
   said pinning structure includes an insulating layer to prevent current flow between said backward extending portion of said first pinned layer structure and said backward extending portion of said second pinned layer structure.

2. A sensor as in claim 1, wherein:
   said first pinned layer structure comprises first and second magnetic layers separated by and antiparallel coupled across a first non-magnetic coupling layer;
   said second pinned layer structure includes third and fourth magnetic layers separated by and antiparallel coupled across a second non-magnetic coupling layer;
   at least a portion of one of said first and second magnetic layer extends backward beyond said sensor stack stripe height to define said backward extending portion of said first pinned layer structure; and
   at least a portion of one of said third and fourth magnetic layers extends backward beyond said sensor stack stripe height to define said backward extending portion of said second pinned layer structure.

3. A sensor as in claim 1, wherein said pinning structure is disposed entirely beyond said sensor stack stripe height in said stripe height direction.

4. A sensor as in claim 1, wherein said pinning structure is disposed entirely beyond said sensor stack stripe height and is disposed entirely between said first and second backward extending portions of said first and second pinned layer structures.

5. A sensor as in claim 1, further comprising a layer of non-magnetic, electrically insulating fill material disposed between said sensor stack and said pinning structure.

6. A sensor as in claim 5, wherein said non-magnetic, electrically insulating material comprises $Al_2O_3$.

7. A sensor as in claim 5 further comprising a layer of Ta disposed over said insulating fill material.

8. A sensor as in claim 1, wherein said pinning structure is exchange coupled with said backward extending portions of said first and second pinned layer structures.

9. A current perpendicular to plane (CPP) magnetoresistive sensor having a surface defining an air bearing surface (ABS), said sensor, comprising:
a first pinned layer structure
a second pinned layer structure;
a free layer disposed between said first and second pinned layer structures;
said first and second pinned layer structures and said free layer forming a sensor stack having a back edge defining a stripe height measured perpendicular to said ABS;
said first pinned layer structure having a backward extending portion extending beyond said stripe height of said sensor stack;
said second pinned layer structure having a backward extending portion extending beyond said stripe height;
a pinning structure disposed between said backward extending portion of said first pinned layer structure and said backward extending portion of said second pinned layer structure; wherein
said pinning structure includes first and second layers of antiferromagnetic material (AFM), said first AFM being exchange coupled with said backward extending portion of said first pinned layer structure, and said second AFM being exchange coupled with said backward extending portion of said second pinned layer structure.

10. A sensor as in claim 9, wherein said AFM layers comprise PtMn.

11. A sensor as in claim 9, further comprising a layer of magnetic material formed over said second AFM layer.

12. A sensor as in claim 11, wherein said layer of magnetic material formed over said second AFM layer comprises CoFe.

13. A current perpendicular to plane (CPP) magnetoresistive sensor having a surface defining an air bearing surface (ABS), said sensor, comprising:
a first pinned layer structure
a second pinned layer structure;
a free layer disposed between said first and second pinned layer structures;
said first and second pinned layer structures and said free layer forming a sensor stack having a back edge defining a stripe height measured perpendicular to said ABS;
said first pinned layer structure having a backward extending portion extending beyond said stripe height of said sensor stack;
said second pinned layer structure having a backward extending portion extending beyond said stripe height;
a pinning structure disposed between said backward extending portion of said first pinned layer structure and said backward extending portion of said second pinned layer structure; wherein said pinning structure comprises:
a first layer of antiferromagnetic material (AFM layer) exchange coupled with said backward extending portion of said first pinned layer structure;
a layer of electrically insulating material formed on said first AFM layer;
a seed layer formed on said layer of electrically insulating material; and
a second AFM layer formed on said seed layer.

14. A sensor as in claim 13, wherein said first and second AFM layers comprise PtMn.

15. A sensor as in claim 13, wherein said insulation layer comprises $Al_2O_3$.

16. A sensor as in claim 13, wherein said seed layer formed on top of said first AFM layer comprises a material having a face centered cubic (FCC) structure.

17. A sensor as in claim 13, wherein said seed layer comprises NiFeCr.

18. A sensor as in claim 13, wherein said seed layer comprises Ta.

19. A sensor as in claim 13, wherein said seed layer comprises Ru.

20. A sensor as in claim 13, wherein said seed layer comprises Ta and NiFeCr.

21. A sensor as in claim 13, wherein said seed layer comprises Ta, NiFeCr, and PtMn.

22. A current perpendicular to plane (CPP) sensor comprising:
a sensor stack formed primarily with a first region extending from an air bearing surface ABS to a sensor stripe height as measured from said ABS;
a pinning structure disposed in a second region recessed from said ABS;
a non-magnetic, dielectric material formed in a central region between said sensor stripe height region and said recessed region, and separating at least a portion of said sensor stack from said pinning structure;
said sensor stack comprising:
a first magnetic layer extending from said ABS to said pinning structure;
a first non-magnetic coupling layer formed over said first magnetic layer;
a second magnetic layer formed on said first non-magnetic coupling layer, said second magnetic layer being antiparallel coupled with said first magnetic layer;
a first non-magnetic, electrically conductive spacer layer formed over said second magnetic layer;
a magnetic free layer;
a second non-magnetic, electrically conductive spacer layer formed over said free layer;
a third magnetic layer formed over said second spacer layer;
a second non-magnetic, electrically conductive coupling layer formed over said third magnetic layer;
a fourth magnetic layer formed over said second coupling layer; and
a fifth magnetic layer formed over said fourth magnetic layer and extending from said ABS to said recessed region; and
said pinning structure being formed between a portion of said first and fifth magnetic layers in said recessed region, said pinning structure further comprising:
a first antiferromagnetic layer (AFM layer) exchange coupled with said first magnetic layer;
a dielectric layer formed over said first AFM layer;
a seed layer formed over said dielectric layer;
a second AFM layer formed over said seed layer; and
a sixth magnetic layer formed over said second AFM layer in said recessed region, said sixth magnetic layer being exchange coupled with said second AFM layer, and also being exchange coupled with said portion of said fifth magnetic layer that extends into said recessed region.

23. A current perpendicular to plane (CPP) sensor comprising:

a sensor stack formed primarily with a first region extending from an air bearing surface ABS to a sensor stripe height as measured from said ABS;

a pinning structure disposed in a second region recessed from said ABS;

a non-magnetic, dielectric material formed in a central region between said sensor stripe height region and said recessed region, and separating at least a portion of said sensor stack from said pinning structure;

said sensor stack comprising:
- a first magnetic layer extending from said ABS to said pinning structure;
- a first non-magnetic coupling layer formed over said first magnetic layer;
- a second magnetic layer formed on said first non-magnetic coupling layer, said second magnetic layer being antiparallel coupled with said first magnetic layer;
- a first non-magnetic, electrically insulating barrier layer formed over said second magnetic layer;
- a magnetic free layer;
- a second non-magnetic, electrically insulating barrier layer formed over said free layer;
- a third magnetic layer formed over said second barrier layer;
- a second non-magnetic, electrically conductive coupling layer formed over said third magnetic layer;
- a fourth magnetic layer formed over said second coupling layer; and
- a fifth magnetic layer formed over said fourth magnetic layer and extending from said ABS to said recessed region; and said pinning structure being formed between a portion of said first and fifth magnetic layers in said recessed region, said pinning structure further comprising:
- a first antiferromagnetic layer (AFM layer) exchange coupled with said first magnetic layer;
- a dielectric layer formed over said first AFM layer;
- a seed layer formed over said dielectric layer;
- a second AFM layer formed over said seed layer; and
- a sixth magnetic layer formed over said second AFM layer in said recessed region, said sixth magnetic layer being exchange coupled with said second AFM layer, and also being exchange coupled with said portion of said fifth magnetic layer that extends into said recessed region.

24. A magnetic data recording system, comprising:

a magnetic media;

a slider;

an actuator, connected with said slider and operable to position said slider adjacent said magnetic media;

a magnetic head formed on said slider, said magnetic head comprising:
- an inductive write element; and
- a current perpendicular to plane (CPP) magnetoresistive sensor having a surface defining an air bearing surface (ABS) and a stripe height direction measured perpendicular to said ABS, said sensor, comprising:
  - first pinned layer structure
  - second pinned layer structure;
  - a free layer disposed between said first and second pinned layer structures;
  - said first and second pinned layer structures and said free layer forming a sensor stack defining a back edge at a point along said stripe height direction;
  - said first pinned layer structure having a backward extending portion extending beyond said back edge of said sensor stack in said stripe height direction;
  - said second pinned layer structure having a backward extending portion extending beyond said back edge of said sensor stack in said stripe height direction;
  - a pinning structure disposed between said backward extending portion of said first pinned layer structure and said backward extending portion of said second pinned layer structure; wherein
  - said pinning structure includes an insulating layer to prevent current flow between said backward extending portion of said first pinned layer structure and said backward extending portion of said second pinned layer structure.

\* \* \* \* \*